(12) United States Patent
Nuno Batista et al.

(10) Patent No.: US 12,582,167 B2
(45) Date of Patent: Mar. 24, 2026

(54) FLEXIBLE HEATER AND ELECTRONICS

(71) Applicant: Philip Morris Products S.A.,
Neuchatel (CH)

(72) Inventors: Rui Nuno Batista, Neuchatel (CH);
Edward Kiernan, Neuchatel (CH)

(73) Assignee: Philip Morris Products S.A.,
Neuchatel (CH)

( * ) Notice: Subject to any disclaimer, the term of this
patent is extended or adjusted under 35
U.S.C. 154(b) by 693 days.

(21) Appl. No.: 17/790,421

(22) PCT Filed: Dec. 21, 2020

(86) PCT No.: PCT/EP2020/087408
§ 371 (c)(1),
(2) Date: Jun. 30, 2022

(87) PCT Pub. No.: WO2021/140018
PCT Pub. Date: Jul. 15, 2021

(65) Prior Publication Data
US 2023/0105496 A1 Apr. 6, 2023

(30) Foreign Application Priority Data
Jan. 9, 2020 (EP) ..................................... 20150990

(51) Int. Cl.
*A24F 40/465* (2020.01)
*A24F 40/20* (2020.01)
(Continued)

(52) U.S. Cl.
CPC ............ *A24F 40/465* (2020.01); *A24F 40/20*
(2020.01); *H05B 6/105* (2013.01); *H05B 6/36*
(2013.01);
(Continued)

(58) Field of Classification Search
CPC ... H05B 6/36; H05B 3/34; H05B 3/04; H05B
3/58; A24F 40/20; A24F 40/465; A24F
40/46
See application file for complete search history.

(56) References Cited

U.S. PATENT DOCUMENTS

2017/0119050 A1* 5/2017 Blandino ............. H05B 3/0014
2019/0320717 A1 10/2019 Tabasso et al.
2020/0260789 A1 8/2020 Yoshimura et al.

FOREIGN PATENT DOCUMENTS

CN 104799438 A 7/2015
CN 208144421 U * 11/2018
(Continued)

OTHER PUBLICATIONS

International Preliminary Report on Patentability and Written Opinion issued Jul. 21, 2022 in PCT/EP2020/087408, 8 pages.
(Continued)

*Primary Examiner* — Thien S Tran
(74) *Attorney, Agent, or Firm* — Oblon, McClelland,
Maier & Neustadt, L.L.P.

(57) ABSTRACT

A heater for an aerosol-generating device is provided, the heater including: a flexible electrically insulating substrate including a first portion, a second portion, and a fourth portion, in which the flexible electrically insulating substrate is rolled into a tube; control electronics disposed on the first portion of the flexible electrically insulating substrate; a heating element including an induction coil and being disposed on the second portion of the flexible electrically insulating substrate; and a susceptor element arranged on the fourth portion of the flexible electrically insulating substrate. An aerosol-generating device is also provided, including a cavity to receive an aerosol-generating article including an aerosol-forming substrate, and the heater. A system is also
(Continued)

provided, including the aerosol-generating device and the aerosol-generating article including the aerosol-forming substrate.

12 Claims, 8 Drawing Sheets

(51) Int. Cl.
*H05B 6/10* (2006.01)
*H05B 6/36* (2006.01)
*H05K 1/02* (2006.01)
*H05K 1/16* (2006.01)

(52) U.S. Cl.
CPC ............. *H05K 1/028* (2013.01); *H05K 1/165* (2013.01); *H05K 2201/051* (2013.01)

(56) References Cited

FOREIGN PATENT DOCUMENTS

| | | | | |
|---|---|---|---|---|
| CN | 208462095 | U | * | 2/2019 |
| EP | 2 316 286 | A1 | | 5/2011 |
| JP | 2013-509160 | A | | 3/2013 |
| JP | 2019-500854 | A | | 1/2019 |
| JP | 2019-525737 | A | | 9/2019 |
| JP | 2019-531740 | A | | 11/2019 |
| KR | 10-1816519 | B1 | | 1/2018 |
| RU | 2 655 239 | C2 | | 5/2018 |
| RU | 2 676 994 | C2 | | 1/2019 |
| WO | WO 2011/050964 | A1 | | 5/2011 |
| WO | WO 2018/001746 | A1 | | 1/2018 |
| WO | WO 2019/092889 | A1 | | 5/2019 |

OTHER PUBLICATIONS

Russian Office Action issued on Nov. 1, 2022 in Russian Patent Application No. 2022117688 (with English translation), 13 pages.
Combined Chinese Office Action and Search Report issued Jul. 26, 2024 in Chinese Patent Application No. 202080084771.7 (with English Translation), 15 pages.
International Search Report mailed on Mar. 23, 2021 in PCT/EP2020/087408 filed on Dec. 21, 2020 (7 pages).
Written Opinion mailed on Mar. 23, 2021 in PCT/EP2020/087408 filed on Dec. 21, 2020 (7 pages).
Japanese Office Action issued Aug. 24, 2023 in Japanese Patent Application No. 2022-541887 (with English Translation), 5 pages.

* cited by examiner

52

50

54

60

58

62

FLEXIBLE HEATER AND ELECTRONICS

The present invention relates to a heater for an aerosol-generating device. The invention further relates to an aerosol-generating device comprising the heater. The invention further relates to a system comprising the aerosol-generating device and an aerosol-generating article comprising aerosol-forming substrate.

It is known to provide an aerosol-generating device for generating an inhalable aerosol. Such devices may heat aerosol-forming substrate to a temperature at which one or more components of the aerosol-forming substrate are volatilised without burning the aerosol-forming substrate. The thus generated vapour forms an aerosol when being cooled down before reaching the mouth of a user. The aerosol-forming substrate may be provided as part of an aerosol-generating article. The aerosol-generating article may have a rod shape for insertion of the aerosol-generating article into a cavity, such as a heating chamber, of the aerosol-generating device. A heater may be arranged around the heating chamber for heating the aerosol-forming substrate once the aerosol-generating article is inserted into the heating chamber of the aerosol-generating device. The heater may be a resistive heating element or an induction heater.

It would be desirable to provide a heater for an aerosol-generating device that is easy to manufacture. It would be desirable to provide a heater for an aerosol-generating device that can be manufactured at low costs. It would be desirable to provide a heater for an aerosol-generating device that is compact. It would be desirable to provide a heater for an aerosol-generating device that has few parts. It would be desirable to provide a heater for an aerosol-generating device that is robust. It would be desirable to provide a heater for an aerosol-generating device that is reliable. It would be desirable to provide a heater for an aerosol-generating device that facilitates homogeneous heating of the aerosol-forming substrate received in the cavity of the aerosol-generating device. It would be desirable to provide an aerosol-generating device that is easy to manufacture.

The above mentioned and further objects may be achieved by an embodiment of the invention, where there may be provided a heater for an aerosol-generating device. The heater may comprise a flexible electrically insulating substrate. The flexible electrically insulating substrate may comprise a first portion and a second portion. The heater may further comprise control electronics. The control electronics may be provided on the first portion of the flexible electrically insulating substrate. The heater may further comprise a heating element. The heating element may be provided on the second portion of the flexible electrically insulating substrate. The flexible electrically insulating substrate may be rolled into a tube. By rolling the flexible electrically insulating substrate into a tube, the flexible electrically insulating substrate assumes a tubular shape.

Due to providing the heating element as well as the control electronics on the flexible electrically insulating substrate of the heater, manufacturing of the heater is made easier and cheaper, because the heater and the associated electronics can be provided on the flexible electrically insulating substrate before it is rolled into a tube. Both of the heating element and the control electronics can be printed on the flexible electrically insulating substrate, for example using metallic inks. During assembly, the flexible electrically insulating substrate comprising the heating element and the control electronics can be brought into a desired shape, e.g. into a tubular shape, by rolling, due to the flexible nature of the substrate.

The flexible electrically insulating substrate may be a flexible dielectric substrate. The flexible electrically insulating substrate may comprise polyimide. The flexible electrically insulating substrate may consist of polyimide. The electrically insulating substrate may comprise any suitable material, and is preferably a material that is able to tolerate high temperatures, such as temperatures in the range 150 degrees Celsius to 250 degrees Celsius, or in the range from 250 degrees Celsius to 350 degrees Celsius) and rapid temperature changes. An example of a suitable material is a polyimide film, such as Kapton®.

The flexible electrically insulating substrate may be flat before assembly of the heater. The first portion of the flexible electrically insulating substrate and the second portion of the flexible electrically insulating substrate may be integrally formed. In other words, the first portion of the flexible electrically insulating substrate and the second portion of the flexible electrically insulating substrate may be part of a single flexible electrically insulating substrate.

The first and second portions may be folded along a connection portion connecting them, such that the first and second portions of the electrically insulating substrate are overlapping. The connection portion is preferably configured as a strip of the flexible electrically insulating substrate connecting the first portion and the second portion. The portions can then be joined together by application of an adhesive, or PEEK and heat. The thus formed laminate substrate can be rolled into a tube. The aerosol-generating device will be described in more detail below. The heater may be arranged around a cavity of the aerosol-generating device for heating the aerosol-forming substrate of the aerosol-generating article inserted into the cavity.

One or both of the first portion of the flexible electrically insulating substrate and the second portion of the flexible electrically insulating substrate may be rectangular. One or both of the first portion of the flexible electrically insulating substrate and the second portion of the flexible electrically insulating substrate may have the shape of a square. One or both of the first portion of the flexible electrically insulating substrate and the second portion of the flexible electrically insulating substrate may have the same shape. The same shape of one or both of the first portion of the flexible electrically insulating substrate and the second portion of the flexible electrically insulating substrate may be chosen in such a way that a spatially optimized arrangement of the portions next to each other is achieved. Particularly, the individual portions of the flexible electrically insulating substrate can be folded to lie on top of each other before being rolled into a tube. This layered arrangement of the individual portions is made easier and optimally using the available space, if the individual portions have the same shape.

The first portion of the flexible electrically insulating substrate may be connected with the second portion of the flexible electrically insulating substrate by a strip of the flexible electrically insulating substrate. The strip of the flexible electrically insulating substrate may be flat. The strip of the flexible electrically insulating substrate may be elongate. The strip of the flexible electrically insulating substrate may be narrow in comparison to one or both of the first portion of the flexible electrically insulating substrate and the second portion of the flexible electrically insulating substrate.

The heating element provided on the second portion of the flexible electrically insulating substrate is electrically connected with the control electronics, which control electronics may be provided on the first portion of the flexible electrically insulating substrate. The connection between the heating element and the control electronics may be facilitated by electrical contacts and/or wires. The electrical wires and/or contacts may be arranged on the strip of the flexible electrically insulating substrate connecting the first portion of the flexible electrically insulating substrate with the second portion of the flexible electrically insulating substrate. At least one of the electrical contacts may be part of a thermocouple configured to measure temperature. A resistive heating track of the heating element as described in more detail below as well as one electrical contact may be configured as a thermocouple. If the heating element comprises at least two resistive heating tracks, a second resistive heating track together with a further electrical contact may be configured as a second thermocouple.

The first portion of the flexible electrically insulating substrate may be arranged at least partly coaxially surrounding the outer perimeter of the second portion of the flexible electrically insulating substrate. After being rolled into a tube, the first portion of the flexible electrically insulating substrate has a tubular shape. The first portion of the flexible electrically insulating substrate may have a hollow tubular shape.

The second portion of the flexible electrically insulating substrate may have a tubular shape. The second portion of the flexible electrically insulating substrate may have a hollow tubular shape. In one embodiment, the first portion and the second portion of the flexible electrically insulating substrate are laminated before being rolled into a tube.

The coaxial arrangement of the first portion of the flexible electrically insulating substrate with respect to the outer perimeter of the second portion of the flexible electrically insulating substrate may create a compact heater. The compact heater may be arranged around the cavity of the aerosol-generating device for heating the aerosol-forming substrate of the aerosol-generating article received in the cavity.

The first portion of the flexible electrically insulating substrate may be arranged fully coaxially surrounding the outer perimeter of the second portion of the flexible electrically insulating substrate.

The heating element may be formed from one or more resistive heating tracks. The heating element may consist of resistive heating tracks. The resistive heating tracks may be provided on the flexible electrically insulating substrate. The resistive heating tracks may be printed on the flexible electrically insulating substrate, for example using metallic inks. The resistive heating tracks may comprise a single resistive heating track. Alternatively, the resistive heating track may comprise at least two resistive heating tracks. The resistive heating tracks may act as an electrically resistive heater.

The resistive heating tracks may have a temperature coefficient of resistance characteristics such that the resistive heating tracks may act as both a resistive heater and as a temperature sensor.

The heating element, preferably in the form of resistive heating tracks, may be electrically connected to a power supply. The heating element may comprise a plurality of portions. If the heating element is provided in the form of resistive heating tracks, the resistive heating tracks may comprise a plurality of portions or a plurality of resistive heating tracks. Each portion of the heating element may be separately connectable to the power supply. This provides a number of advantages. First, it allows the different portions to be heated for different durations, which may enhance the smoking experience, depending on the nature of the aerosol-forming substrate. Second, it allows the different portions to be heated at different temperatures, which may also enhance the smoking experience, depending on the nature of the aerosol-forming substrate. Third, it allows a particular portion of the heater to be activated at any one time. This allows only a portion of the aerosol-forming substrate to be heated at any one time.

The heater may comprise a power supply. The power supply is preferably configured as a battery. The power supply may be provided on a third portion of the flexible electrically insulating substrate. The power supply may be configured as a Lithium-ion battery. Alternatively, the power supply may be a Nickel-metal hydride battery, a Nickel cadmium battery, or a Lithium based battery, for example a Lithium-Cobalt, a Lithium-Iron-Phosphate, Lithium Titanate or a Lithium-Polymer battery. As an alternative, the power supply may be another form of charge storage device such as a capacitor. The power supply may require recharging and may have a capacity that enables to store enough energy for one or more usage experiences; for example, the power supply may have sufficient capacity to continuously generate aerosol for a period of around six minutes or for a period of a multiple of six minutes. In another example, the power supply may have sufficient capacity to provide a predetermined number of puffs or discrete activations of the heater.

The power supply may be flat. The power supply may be a flat battery. The power supply may be flexible. The power supply may be a flexible battery. The power supply may be a flat and flexible battery. The power supply may be provided as a flexible flat sheet on the third portion of the flexible electrically insulating substrate. The third portion of the flexible electrically insulating substrate may be rectangular. The third portion of the flexible electrically insulating substrate may have the shape of a square. The third portion of the flexible electrically insulating substrate and one or both of the first portion of the flexible electrically insulating substrate and the second portion of the flexible electrically insulating substrate may have the same shape. The same shape of the portions of the flexible electrically insulating substrate may spatially optimize arrangement of the portions next to each other.

The third portion of the flexible electrically insulating substrate may be integrally formed with one or both of the first portion of the flexible electrically insulating substrate and the second portion of the flexible electrically insulating substrate. In other words, the first, second and third portions of the flexible electrically insulating substrate may be individual portions of a single flexible electrically insulating substrate. The third portion of the flexible electrically insulating substrate may be connected with one or both of the first portion of the flexible electrically insulating substrate and the second portion of the flexible electrically insulating substrate. In a preferred embodiment, the third portion of the flexible electrically insulating substrate is attached to and arranged adjacent to the first portion of the flexible electrically insulating substrate.

The third portion of the flexible electrically insulating substrate may be rolled into a tube. In a preferred embodiment, the third portion of the flexible electrically insulating substrate is rolled into a tube together with the second portion of the flexible electrically insulating substrate to form a common tubular structure.

The second portion of the flexible electrically insulating substrate comprising the heating element may be arranged at least partly coaxially surrounding the outer perimeter of the third portion of the flexible electrically insulating substrate comprising the power supply. This arrangement is particularly preferred, if the heating element is configured as an induction heating element as described in more detail below. Alternatively, the heating element may be configured as an electrically resistive heating element. In this case, the second portion of the flexible electrically insulating substrate comprising the heating element is preferably arranged at least partly coaxially within the third portion of the flexible electrically insulating substrate comprising the power supply.

The heating element may comprise an induction coil. The heating element may comprise at least two induction coils. The induction coil may be electrically connected to the power supply. The controller electronics may be configured to control the supply of electrical energy from the power supply to the induction coil. The induction coil may be configured to generate an alternating magnetic field.

The flexible electrically insulating substrate may comprise a fourth portion. The heater may further comprise a susceptor element arranged on the fourth portion of the flexible electrically insulating substrate.

The susceptor may be flat. The susceptor may be flexible. The susceptor may be provided as a flexible flat sheet on the fourth portion of the flexible electrically insulating substrate. The fourth portion of the flexible electrically insulating substrate may be rectangular. The fourth portion of the flexible electrically insulating substrate may have the shape of a square. The fourth portion of the flexible electrically insulating substrate and one or more of the first portion of the flexible electrically insulating substrate, the second portion of the flexible electrically insulating substrate and the third portion of the flexible electrically insulating substrate may have the same shape. The same shape of the portions of the flexible electrically insulating substrate may spatially optimize arrangement of the portions next to each other.

The fourth portion of the flexible electrically insulating substrate may be integrally formed with one or more of the first portion of the flexible electrically insulating substrate, the second portion of the flexible electrically insulating substrate and the third portion of the flexible electrically insulating substrate. In other words, the first, second, third and fourth portions of the flexible electrically insulating substrate may be individual portions of a single flexible electrically insulating substrate. The fourth portion of the flexible electrically insulating substrate may be connected with one or more of the first portion of the flexible electrically insulating substrate, the second portion of the flexible electrically insulating substrate and the third portion of the flexible electrically insulating substrate. In a preferred embodiment, the fourth portion of the flexible electrically insulating substrate is attached to and arranged adjacent to the second portion of the flexible electrically insulating substrate, at least before providing the second and fourth portions of the flexible electrically insulating substrate in the tube.

In general, a susceptor is a material that is capable of absorbing electromagnetic energy and converting it to heat. When located in an alternating magnetic field. If the susceptor is conductive, then typically eddy currents are induced by the alternating magnetic field. If the susceptor is magnetic, then typically another effect that contributes to the heating is commonly referred to hysteresis losses. Hysteresis losses occur mainly due to the movement of the magnetic domain blocks within the susceptor, because the magnetic orientation of these will align with the magnetic induction field, which alternates. Another effect contributing to the hysteresis loss is when the magnetic domains will grow or shrink within the susceptor. Commonly all these changes in the susceptor that happen on a nano-scale or below are referred to as "hysteresis losses", because they produce heat in the susceptor. Hence, if the susceptor is both magnetic and electrically conductive, both hysteresis losses and the generation of eddy currents will contribute to the heating of the susceptor. If the susceptor is magnetic, but not conductive, then hysteresis losses will be the only means by which the susceptor will heat, when penetrated by an alternating magnetic field. According to the invention, the susceptor may be electrically conductive or magnetic or both electrically conductive and magnetic. An alternating magnetic field generated by one or several induction coils heat the susceptor, which then transfers the heat to the aerosol-forming substrate, such that an aerosol is formed. The heat transfer may be mainly by conduction of heat. Such a transfer of heat is best, if the susceptor is in close thermal contact with the aerosol-forming substrate.

The susceptor may be formed from any material that can be inductively heated to a temperature sufficient to generate an aerosol from the aerosol-forming substrate. A preferred susceptor may comprise or consist of a ferromagnetic material or ferri-magnetic material, for example a ferromagnetic alloy, ferritic iron, or a ferromagnetic steel or stainless steel. A suitable susceptor may be, or comprise, aluminium. Preferred susceptors may be heated to a temperature in excess of 250 degrees Celsius.

Preferred susceptors are metal susceptors, for example stainless steel. However, susceptor materials may also comprise or be made of graphite, molybdenum, silicon carbide, aluminum, niobium, Inconel alloys (austenite nickel-chromium-based superalloys), metallized films, ceramics such as for example zirconia, transition metals such as for example iron, cobalt, nickel, or metalloids components such as for example boron, carbon, silicon, phosphorus, aluminium.

Preferably, the susceptor material is a metallic susceptor material (by metallic is meant a metal in a non-oxide form, which usually is referred to as ceramics). The susceptor may also be a multi-material susceptor and may comprise a first susceptor material and a second susceptor material. In some embodiments, the first susceptor material may be disposed in intimate physical contact with the second susceptor material. The first and/or second susceptor material preferably has a Curie temperature that is below the combustion temperature of the aerosol-forming substrate. The first susceptor material is preferably used primarily to heat the susceptor when the susceptor is placed in a fluctuating electromagnetic field. Any suitable material may be used. For example the first susceptor material may be aluminium, or may be a ferrous material such as a stainless steel. The second susceptor material is preferably used primarily to indicate when the susceptor has reached a specific temperature, that temperature being the Curie temperature of the second susceptor material. The Curie temperature of the second susceptor material can be used to regulate the temperature of the entire susceptor during operation. Suitable materials for the second susceptor material may include nickel and certain nickel alloys.

By providing a susceptor having at least a first and a second susceptor material, the heating of the aerosol-forming substrate and the temperature control of the heating may be separated. Preferably the second susceptor material is a magnetic material having a second Curie temperature that is substantially the same as a desired maximum heating temperature. That is, it is preferable that the second Curie temperature is approximately the same as the temperature that the susceptor should be heated to in order to generate an aerosol from the aerosol-forming substrate.

By the term "Curie temperature" is generally understood as the temperature at, which a magnetic material loses its magnetic properties in the absence of an external magnetic field. Hence, the Curie temperature is a temperature at which a ferro- or ferri-magnetic material undergoes a phase change and becomes paramagnetic.

When an induction heating element is employed, the induction heating element may be configured as an external heater as described herein. If the induction heating element is configured as an external heating element, the susceptor element is preferably configured as a cylindrical susceptor at least partly surrounding the cavity or forming the sidewall of the cavity.

The fourth portion of the flexible electrically insulating substrate may be rolled into a tube.

One or both of the second portion of the flexible electrically insulating substrate comprising the heating element and the third portion of the flexible electrically insulating substrate comprising the power supply may be arranged at least partly coaxially surrounding the outer perimeter of the fourth portion of the flexible electrically insulating substrate comprising the susceptor element. The fourth portion may be the most inner portion of the flexible electrically insulating substrate, after the flexible electrically insulating substrate is rolled into a tube.

The final heater including all individual portions of the flexible electrically insulating substrate is preferably rolled into a tube. All of the individual portions of the flexible electrically insulating substrate are preferably at least partially, more preferably fully, coaxially aligned with each other.

If the flexible electrically insulating substrate of the final heater comprises the first portion of the flexible electrically insulating substrate and the second portion of the flexible electrically insulating substrate, the second portion of the flexible electrically insulating substrate is preferably configured as the inner layer of the heater and the first portion of the flexible electrically insulating substrate is preferably configured as the outer layer of the tubular heater. The heating element arranged on the second portion of the flexible electrically insulating substrate this embodiment preferably configured as a resistive heater.

If the flexible electrically insulating substrate of the final heater further comprises the third portion comprising the power supply, the third portion is preferably arranged between the first portion of the flexible electrically insulating substrate and the second portion of the flexible electrically insulating substrate. In other words, the third portion is preferably arranged between the first and second portions of the flexible electrically insulating substrate. The third portion may thus be sandwiched between the first portion and the second portion of the flexible electrically insulating substrate.

If the flexible electrically insulating substrate of the final heater further comprises the fourth portion comprising the susceptor, the heating element arranged on the second portion of the flexible electrically insulating substrate is preferably configured as an induction coil. In this embodiment, the fourth portion comprising the susceptor is preferably arranged as the inner layer of the heater, while the second portion comprising the heating element is preferably configured at least partly surrounding, preferably fully surrounding, the fourth portion of the flexible electrically insulating substrate. One or both of the first portion comprising the control electronics and the third portion comprising the power supply may be arranged between the inner fourth portion comprising the susceptor and the second portion comprising the heating element.

The heater may comprise a finishing layer of laminated material that is arranged at least partly covering the heater. The finishing layer may be configured as the outer layer of the heater. The finishing layer may be configured to protect the heater. The finishing layer may be configured fully covering the outer perimeter of the heater. The finishing layer may be configured to enhance one or more of ultraviolet resistance, infrared resistance, printability of branding, overall external design colouring, texture, mechanical resistance, chemical resistance, and other characteristics of the heater as required. The finishing layer may be configured as a wrapper. The finishing layer may be wrapped around the heater.

The terms 'inner' and 'outer' refer to the spatial arrangement of the individual portions of the flexible electrically insulating substrate and of the finishing layer of the heater. The term 'inner' denotes a lateral direction towards a central longitudinal axis of the heater. The term 'outer' denotes a lateral direction away from the central longitudinal axis of the heater. An 'inner' element of the heater is arranged closer to the longitudinal central axis of the heater in comparison to an 'outer' element of the heater.

The invention may further relate to a method of forming the heater. The heater may be formed from an initially planar flat sheet of flexible electrically insulating substrate. The planar flat sheet of flexible electrically insulating substrate may subsequently be appropriately shaped. Particularly, the planar flat sheet of flexible electrically insulating substrate may be shaped such that the first portion of the flexible electrically insulating substrate is formed connected via a strip of flexible electrically insulating substrate to the second portion of the flexible electrically insulating substrate. Optionally, one or both of the third portion and the fourth portion of the flexible electrically insulating substrate may be formed. Subsequently, one or both of the heating element may be arranged on, preferably printed on, the second portion and the control electronics may be arranged on, preferably printed on, the first portion. Subsequently, the heater is rolled such that one or more of the first to fourth portions of the flexible electrically insulating substrate are rolled into a tube. One or more of the first to fourth portions of the flexible electrically insulating substrate are, during this process, preferably at least partially, more preferably fully, coaxially aligned with each other. Exemplarily, the second portion comprising the heating element is initially rolled to form a tube. The strip connecting the second portion with the first portion comprising the control electronics may be flipped such that the first portion overlies the second portion. The first portion may subsequently be rolled around the second portion such that a tubular heater arrangement is achieved with an inner second portion and an outer first portion.

The first portion of the flexible electrically insulating substrate comprising the control electronics may have a thickness of between 0.025 millimeters to 3.50 millimeters, preferably between 0.035 millimeters to 2.75 millimeters.

The second portion of the flexible electrically insulating substrate comprising the heating element may have a thickness of between 0.02 millimeters to 3.50 millimeters, preferably between 0.035 millimeters to 2.7 millimeters.

The third portion of the flexible electrically insulating substrate comprising the power supply may have a thickness of between 0.02 millimeters to 4.50 millimeters, preferably between 0.035 millimeters to 2.5 millimeters.

The invention further relates to an aerosol-generating device comprising a cavity configured for receiving an aerosol-generating article comprising aerosol-forming substrate. The aerosol-generating device further comprises the heater as described herein. The heater is arranged at least partly coaxially surrounding the outer perimeter of the cavity.

The heater is configured for heating the aerosol-forming substrate of the aerosol-generating article, when the aerosol-generating article is received in the cavity. To optimize heat transfer from the heater to the aerosol-forming substrate, the heater is arranged at least partly coaxially surrounding the outer perimeter of the cavity. In this way, the heat can be transferred to the aerosol-forming substrate in a radial inward direction. Preferably, the heater is arranged fully coaxially surrounding the outer perimeter of the cavity.

The heater may comprise the power supply as described herein. Alternatively, the aerosol-generating device may comprise a power supply, preferably a battery. The control electronics of the heater may be configured to control the supply of electrical energy from the power supply of the aerosol-generating device to the heating element of the heater. As a further alternative, the heater may comprise the power supply and the aerosol-generating device may comprise an additional power supply, preferably a battery. The control electronics of the heater may be configured to control the supply of electrical energy from the power supply of the heater and from the additional power supply of the aerosol-generating device to the heating element of the heater. Further to the control electronics of the heater, the aerosol-generating device may comprise a controller. The control electronics of the heater may be configured to control the supply of electrical energy from the power supply of the heater to the heating element. The controller of the aerosol-generating device may be configured to control the supply of electrical energy from the additional power supply of the aerosol-generating device to the heating element of the heater.

The aerosol-generating device may comprise a main body. One or both of the additional power supply and the controller of the aerosol-generating device may be arranged in the main body. The aerosol-generating device may comprise a mouth end portion. The cavity may be arranged in the mouth end portion. The mouth end portion may be integrally formed with the main body. Alternatively, the mouth end portion may be configured removably attachable to the main body. The mouth end portion may comprise a mouthpiece. The mouthpiece may be configured to cover the cavity. Exemplarily, the mouthpiece may be connected with the mouth end portion by a hinge connection. Alternatively, the mouthpiece may be removably attachable to the mouth end portion of the aerosol-generating device. As a further alternative, no mouthpiece is provided and a user directly draws on a proximal end of the aerosol-generating article received in the cavity of the mouth end portion.

The heater may at least partly form a sidewall of the cavity. Heat transfer may be optimized by the heater at least partly forming the sidewall. The heater may fully form the sidewall of the cavity.

As used herein, an 'aerosol-generating device' relates to a device that interacts with an aerosol-forming substrate to generate an aerosol. The aerosol-forming substrate may be part of an aerosol-generating article, for example part of a smoking article. An aerosol-generating device may be a smoking device that interacts with an aerosol-forming substrate of an aerosol-generating article to generate an aerosol that is directly inhalable into a user's lungs thorough the user's mouth. An aerosol-generating device may be a holder. The device may be an electrically heated smoking device. The aerosol-generating device may comprise a housing, electric circuitry, a power supply, a heating chamber and a heating element.

The invention further relates to a system comprising the aerosol-generating device as described herein and an aerosol-generating article comprising aerosol-forming substrate.

As used herein, the term 'aerosol-generating article' refers to an article comprising an aerosol-forming substrate that is capable of releasing volatile compounds that can form an aerosol. For example, an aerosol-generating article may be a smoking article that generates an aerosol that is directly inhalable into a user's lungs through the user's mouth. An aerosol-generating article may be disposable.

The aerosol-generating article may be substantially cylindrical in shape. The aerosol-generating article may be substantially elongate. The aerosol-generating article may have a length and a circumference substantially perpendicular to the length. The aerosol-generating article may be substantially rod shaped. The aerosol-forming substrate may be substantially cylindrical in shape. The aerosol-forming substrate may be substantially elongate. The aerosol-forming substrate may also have a length and a circumference substantially perpendicular to the length. The aerosol-forming substrate may be substantially rod shaped.

The aerosol-generating substrate may comprise an aerosol-former. The aerosol-generating substrate preferably comprises homogenised tobacco material, an aerosol-former and water. Providing homogenised tobacco material may improve aerosol generation, the nicotine content and the flavour profile of the aerosol generated during heating of the aerosol-generating article. Specifically, the process of making homogenised tobacco involves grinding tobacco leaf, which more effectively enables the release of nicotine and flavours upon heating.

The homogenised tobacco material is preferably provided in sheets which are one of folded, crimped, or cut into strips. In a particularly preferred embodiment, the sheets are cut into strips having a width of between about 0.2 millimetres and about 2 millimetres, more preferably between about 0.4 millimetres and about 1.2 millimetres. In one embodiment, the width of the strips is about 0.9 millimetres.

Alternatively, the homogenised tobacco material may be formed into spheres using spheronisation. The mean diameter of the spheres is preferably between about 0.5 millimetres and about 4 millimetres, more preferably between about 0.8 millimetres and about 3 millimetres.

The aerosol-generating substrate preferably comprises: homogenised tobacco material between about 55 percent and about 75 percent by weight; aerosol-former between about 15 percent and about 25 percent by weight; and water between about 10 percent and about 20 percent by weight.

Before measuring the samples of aerosol-generating substrate they are equilibrated for 48 hours at 50 percent relative humidity at 22 degrees Celsius. The Karl Fischer technique is used to determine the water content of the homogenised tobacco material.

The aerosol-generating substrate may further comprise a flavourant between about 0.1 percent and about 10 percent by weight. The flavourant may be any suitable flavourant known in the art, such as menthol.

Sheets of homogenised tobacco material for use in aerosol-generating articles comprising a capsule may be formed by agglomerating particulate tobacco obtained by grinding or otherwise comminuting one or both of tobacco leaf lamina and tobacco leaf stems.

Sheets of homogenised tobacco material for use in aerosol-generating articles comprising a capsule may comprise one or more intrinsic binders that is a tobacco endogenous binder, one or more extrinsic binders that is a tobacco exogenous binder, or a combination thereof to help agglomerate the particulate tobacco. Alternatively, or in addition, sheets of homogenised tobacco material may comprise other additives including, but not limited to, tobacco and non-tobacco fibres, flavourants, fillers, aqueous and non-aqueous solvents and combinations thereof.

Suitable extrinsic binders for inclusion in sheets of homogenised tobacco material for use in aerosol-generating articles comprising a capsule are known in the art and include, but are not limited to: gums such as, for example, guar gum, xanthan gum, arabic gum and locust bean gum; cellulosic binders such as, for example, hydroxypropyl cellulose, carboxymethyl cellulose, hydroxyethyl cellulose, methyl cellulose and ethyl cellulose; polysaccharides such as, for example, starches, organic acids, such as alginic acid, conjugate base salts of organic acids, such as sodium-alginate, agar and 30 pectins; and combinations thereof.

A number of reconstitution processes for producing sheets of homogenised tobacco materials are known in the art. These include, but are not limited to: paper-making processes of the type described in, for example, U.S. Pat. No. 3,860,012; casting or 'cast leaf' processes of the type described in, for example, U.S. Pat. No. 5,724,998; dough reconstitution processes of the type described in, for example, U.S. Pat. No. 3,894,544; and extrusion processes of the type described in, for example, in GB-A-983,928. Typically, the densities of sheets of homogenised tobacco material produced by extrusion processes and dough reconstitution processes are greater than the densities of sheets of homogenised tobacco materials produced by casting processes.

Sheets of homogenised tobacco material for use in aerosol-generating articles comprising a capsule are preferably formed by a casting process of the type generally comprising casting a slurry comprising particulate tobacco and one or more binders onto a conveyor belt or other support surface, drying the cast slurry to form a sheet of homogenised tobacco material and removing the sheet of homogenised tobacco material from the support surface.

The homogenised tobacco sheet material may be produced using different types of tobacco. For example, tobacco sheet material may be formed using tobaccos from a number of different varieties of tobacco, or tobacco from different regions of the tobacco plant, such as leaves or stem. After processing, the sheet has consistent properties and a homogenised flavour. A single sheet of homogenised tobacco material may be produced to have a specific flavour. To produce a product having a different flavour, a different tobacco sheet material needs to be produced. Some flavours that are produced by blending a large number of different shredded tobaccos in a conventional cigarette may be difficult to replicate in a single homogenised tobacco sheet. For example, Virginia tobaccos and Burley tobaccos may need to be processed in different ways to optimise their individual flavours. It may not be possible to replicate a particular blend of Virginia and Burley tobaccos in a single sheet of homogenised tobacco material. As such, the aerosol-generating substrate may comprise a first homogenised tobacco material and a second homogenised tobacco material. By combining two different sheets of tobacco material in a single aerosol-generating substrate, new blends may be created that could not be produced by a single sheet of homogenised tobacco.

The aerosol-former preferably comprises at least one polyhydric alcohol. In a preferred embodiment, the aerosol-former comprises at least one of: triethylene glycol; 1,3-butanediol; propylene glycol; and glycerine.

Below, there is provided a non-exhaustive list of non-limiting examples. Any one or more of the features of these examples may be combined with any one or more features of another example, embodiment, or aspect described herein.

Example A: Heater for an aerosol-generating device, the heater comprising:

a flexible electrically insulating substrate, wherein the flexible electrically insulating substrate comprises a first portion and a second portion, control electronics, wherein the control electronics are provided on the first portion of the flexible electrically insulating substrate, and a heating element, wherein the heating element is provided on the second portion of the flexible electrically insulating substrate, wherein the flexible electrically insulating substrate is rolled into a tube.

Example B: Heater according to example A, wherein the first portion of the flexible electrically insulating substrate is arranged at least partly coaxially surrounding the outer perimeter of the second portion of the flexible electrically insulating substrate.

Example C: Heater according to example B, wherein the first portion of the flexible electrically insulating substrate is arranged fully coaxially surrounding the outer perimeter of the second portion of the flexible electrically insulating substrate.

Example D: Heater according to any of the preceding examples, wherein the heating element comprises resistive heating tracks, preferably wherein the heating element consists of resistive heating tracks.

Example E: Heater according to any of examples A to C, wherein the heating element comprises an induction coil.

Example F: Heater according to example E, wherein the flexible electrically insulating substrate comprises a third portion, and wherein the heater further comprises a power supply arranged on the third portion of the flexible electrically insulating substrate.

Example G: Heater according to example F, wherein the third portion of the flexible electrically insulating substrate is rolled into a tube.

Example H: Heater according to example G, wherein the second portion of the flexible electrically insulating substrate comprising the heating element is arranged at least partly coaxially surrounding the outer perimeter of the third portion of the flexible electrically insulating substrate comprising the power supply.

Example I: Heater according to any of examples E to H, wherein the flexible electrically insulating substrate comprises a fourth portion, and wherein the heater further comprises a susceptor element arranged on the fourth portion of the flexible electrically insulating substrate.

Example J: Heater according to example I, wherein the fourth portion of the flexible electrically insulating substrate is rolled into a tube.

Example K: Heater according to example J, wherein one or both of the second portion of the flexible electrically insulating substrate comprising the heating element and the third portion of the flexible electrically insulating substrate comprising the power supply is/are arranged at least partly coaxially surrounding the outer perimeter of the fourth portion of the flexible electrically insulating substrate comprising the susceptor element.

Example L: Heater according to any of the preceding examples, wherein the heater comprises a finishing layer of laminated material that is arranged at least partly covering the heater.

Example M: Aerosol-generating device comprising:
a cavity configured for receiving an aerosol-generating article comprising aerosol-forming substrate, and
the heater according to any of the preceding examples, wherein the heater is arranged at least partly coaxially surrounding the outer perimeter of the cavity.

Example N: Aerosol-generating device according to example M, wherein the heater at least partly forms the sidewall of the cavity.

Example O: System comprising the aerosol-generating device according to example M or N and an aerosol-generating article comprising aerosol-forming substrate.

Features described in relation to one embodiment may equally be applied to other embodiments of the invention.

The invention will be further described, by way of example only, with reference to the accompanying drawings in which.

Figure 1:
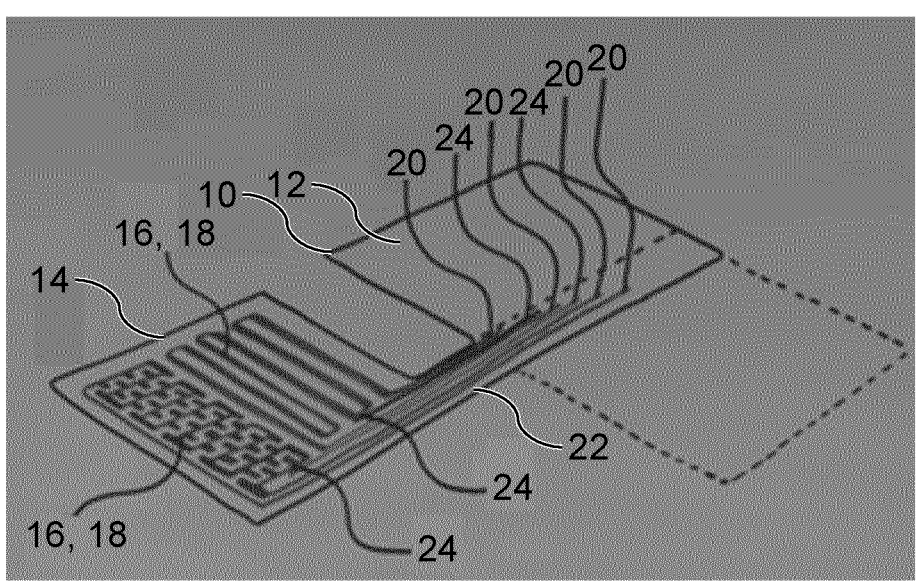
FIG. 1 shows a flexible electrically insulating substrate sheet of a heater before assembly.

FIG. 1 shows a flat flexible electrically insulating substrate sheet. The sheet is shown before assembly of the heater. The flexible electrically insulating substrate comprises a first portion of the flexible electrically insulating substrate 10. Control electronics 12 of the final heater are arranged on the first portion of the flexible electrically insulating substrate 10. The control electronics 12 are preferably printed on the first portion of the flexible electrically insulating substrate 10.

The flat flexible electrically insulating substrate sheet further comprises a second portion of the flexible electrically insulating substrate 14. A heating element 16 is arranged on the second portion of the flexible electrically insulating substrate 14. The heating element 16 is preferably printed on the second portion of the flexible electrically insulating substrate 14. The heating element 16 is configured as resistive heating tracks 18. As shown in FIG. 1, the heating element 16 may comprise at least two resistive heating tracks 18. The two resistive heating tracks 18 are electrically isolated from each other. The electrical isolation between the two heating tracks is facilitated by printing the two resistive heating tracks 18 spatially distanced from each other on the second portion of the flexible electrically insulating substrate 14.

The heating element 16 is electrically connected with the control electronics 12. The electrical connection between the heating element 16 and the control electronics 12 is facilitated by electrical contacts 20. The electrical contacts 20 run over a strip of flexible electrically insulating substrate 22. The strip of flexible electrically insulating substrate 22 is arranged between the first portion of the flexible electrically insulating substrate 10 and the second portion of the flexible electrically insulating substrate 14. The strip of flexible electrically insulating substrate 22 facilitates the connection between the portions 10, 14 and bridges the first portion of the flexible electrically insulating substrate 10 and the second portion of the flexible electrically insulating substrate 14.

FIG. 1 further shows an option of temperature measurement. For measuring the temperature of the heater, a thermocouple 24 may be provided. The thermocouple 24 may comprise one of the resistive heating tracks 18 and one of the electrical contacts 20.

The formation of the heater from the flexible electrically insulating substrate is indicated by the dashed line in FIG. 1. The dashed line indicates how the first portion of the flexible electrically insulating substrate 10 can be rolled into a tube. After rolling the first portion of the flexible electrically insulating substrate 10 into a tube, the first portion of the flexible electrically insulating substrate 10 is rolled into a tube.

Figures 2, 2A, 2B, 2C, 2D:
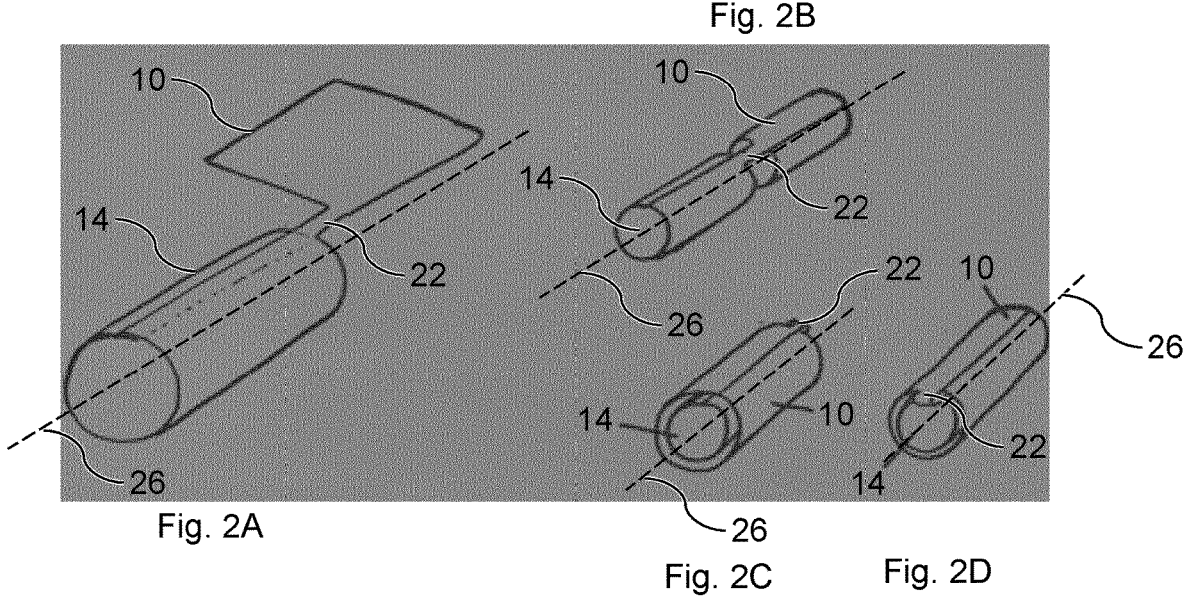
FIG. 2 shows the flexible electrically insulating substrate sheet during assembly of the heater.

FIG. 2 shows assembly of the heater from the flat flexible electrically insulating substrate sheet shown in FIG. 1. FIG. 1A shows that the second portion of the flexible electrically insulating substrate 14 is rolled into a tube. Opposite sides of the second portion of the flexible electrically insulating substrate 14 may be folded to lie on top of each other, possible including a spacer layer (not shown), and attached to each other by a known process, after which the "stack" or laminate of portions is rolled into a tube to form a tubular heater structure. The same principle rolling and attachment configuration may be applied to all of the portions of the flexible electrically insulating substrate. FIG. 2B shows an embodiment, in which the first portion of the flexible electrically insulating substrate 10 is rolled into a tube similar to the second portion of the flexible electrically insulating substrate 14. In this embodiment, the first and second portions 10, 14 are arranged distanced from each other along a longitudinal central axis 26 of the heater. FIG. 2C shows an alternative arrangement, in which the strip of flexible electrically insulating substrate 22 has been flipped and the first portion of the flexible electrically insulating substrate 10 is rolled surrounding the second portion of the flexible electrically insulating substrate 14. In this embodiment, the second portion of the flexible electrically insulating substrate 14 is rolled into a tube initially followed by rolling the first portion of the flexible electrically insulating substrate 10 around the second portion of the flexible electrically insulating substrate 14. Consequently, the second portion of the flexible electrically insulating substrate 14 is configured as an inner portion, while the first portion of the flexible electrically insulating substrate 10 is configured as an outer portion. As a preferred embodiment, both of the first portion of the flexible electrically insulating substrate 10 and the second portion of the flexible electrically insulating substrate 14 are rolled together to form the tube. In this embodiment, the first portion of the flexible electrically insulating substrate 10 and the second portion of the flexible electrically insulating substrate 14 are initially folded to lie on top of each other. After being folded on top of each other, the first portion of the flexible electrically insulating substrate 10 and the second portion of the flexible electrically insulating substrate 14 are laminated together. FIG. 2D shows the heater of FIG. 2C from an opposite direction such that the strip of flexible electrically insulating substrate 22 is clearly visible.

Figure 3:
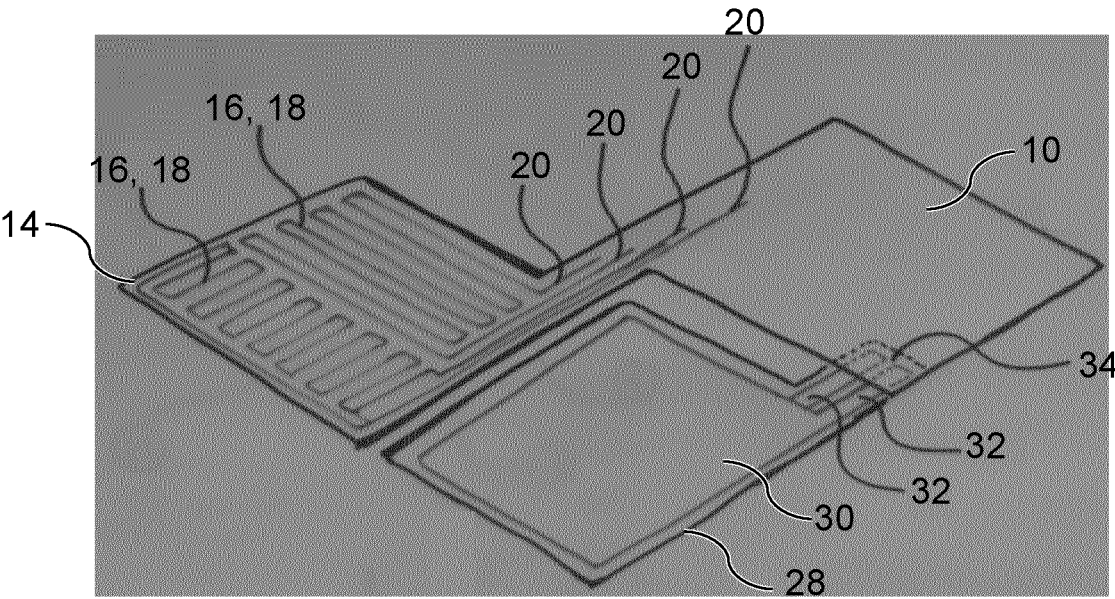
FIG. 3 shows a further embodiment of a flexible electrically insulating substrate sheet of a heater before assembly.

FIG. 3 shows a further embodiment, in which the flat flexible electrically insulating substrate sheet further comprises a third portion of the flexible electrically insulating substrate 28. A power supply 30 in the form of a battery is arranged on the third portion of the flexible electrically insulating substrate 28. The battery is configured as a flexible battery that can be rolled into a tube together with the third portion of the flexible electrically insulating substrate 28. As shown in FIG. 3, the power supply 30 is electrically connected with the control electronics 12 of the first portion of the flexible electrically insulating substrate 10. The connection between the power supply 30 and the control electronics 12 is facilitated by battery contacts 32. The battery contacts 32 are attached to a contact region 34 of the first portion of the flexible electrically insulating substrate 10.

Figure 4:
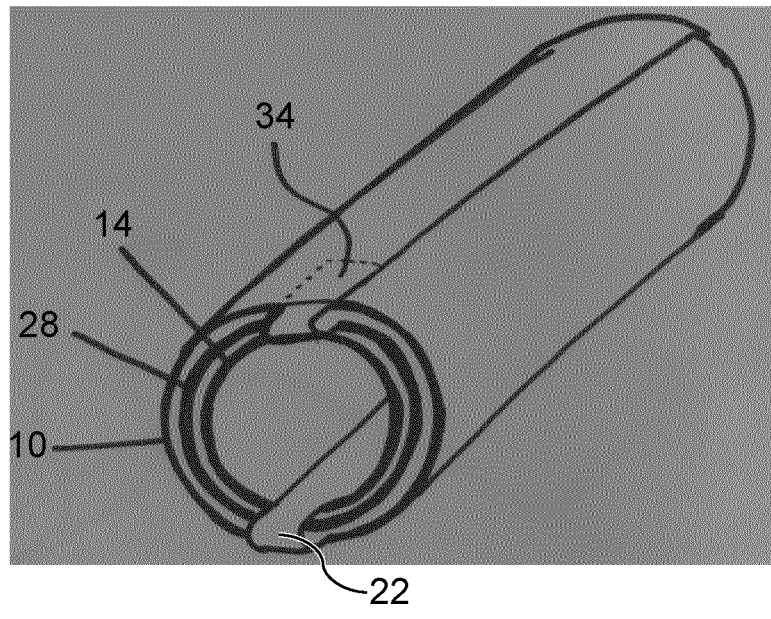
FIG. 4 shows the flexible electrically insulating substrate sheet of FIG. 3 after assembly of the heater.

FIG. 4 shows the heater after assembly of the heater using the flexible electrically insulating substrate shown in FIG. 3. In contrast to the embodiment shown in FIGS. 1 and 2, the heater shown in FIG. 4 additionally comprises the third portion of the flexible electrically insulating substrate 28 comprising the power supply 30. The third portion of the flexible electrically insulating substrate 28 is sandwiched between the first portion of the flexible electrically insulating substrate 10 and the second portion of the flexible electrically insulating substrate 14. The third portion of the flexible electrically insulating substrate 28 is arranged sandwiched between the first and second portions 10, 14 of the flexible electrically insulating substrate.

Figure 5:
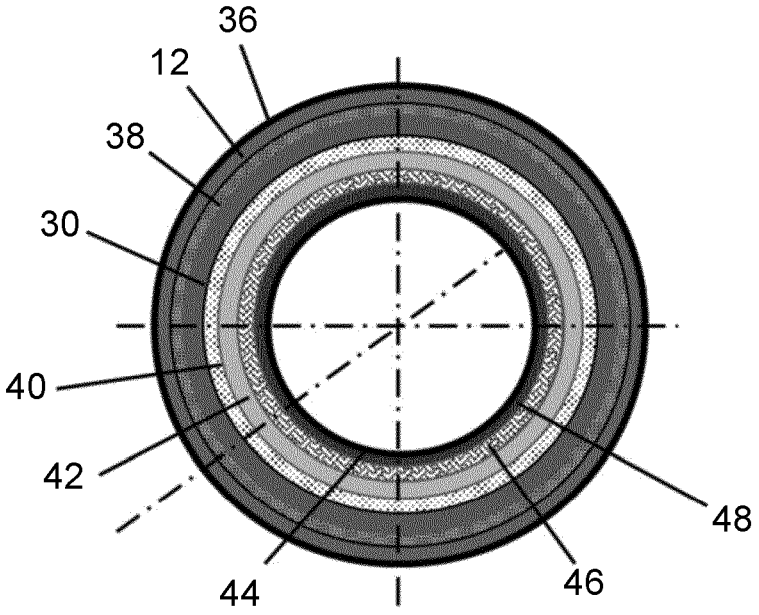
FIG. 5 shows a cross-sectional view of the final heater with multiple potential layers.

FIG. 5 shows a cross-sectional view of the final heater. In addition to the portions 10, 14, 28 of the flexible electrically insulating substrate, the heater shown in FIG. 5 comprises multiple further layers. All of these layers are optional. The individual layers and their function will be described in the following.

In the embodiments shown in FIGS. 1 to 4, the heating element 16 is preferably configured as a resistive heater. As a consequence, the second portion of the flexible electrically insulating substrate 14 comprising the heating element 16 is configured as an inner layer. In the embodiment shown in FIG. 5, the heating element 16 is configured as an inductive heating element 16. As a consequence, the second portion of the flexible electrically insulating substrate 14 comprising the heating element 16 is arranged distanced from the most inner layer of the heater in a radially outward direction.

The heating element 16 in the embodiment of FIG. 5 comprises an induction coil 42. The induction coil 42 is configured to receive an alternating current from the power supply 30 and configured to generate an alternating magnetic field. The heater comprises a further layer comprising a susceptor element 48. The susceptor element 48 is configured as the inner layer of the heater. The susceptor element 48 may be arranged on a fourth portion of the flexible electrically insulating substrate as described herein. The alternating magnetic field created by the induction coil 42 is configured to heat the susceptor element. Between the inner layer comprising the susceptor element 48 and the second portion of the flexible electrically insulating substrate 14 comprising the heating element 16, a spacer layer 46 is provided. The spacer layer 46 electrically isolates the induction coil 42 from the susceptor element 48. Optionally, a consolidating cavity 54 wall layer 44 may be provided. The consolidating cavity 54 wall layer 44 may be arranged to form the cavity 54 of the aerosol-generating device 50. The consolidating cavity 54 wall layer 44 may be part of the aerosol-generating device 50 and not part of the heater. The consolidating cavity 54 wall layer 44 may be arranged directly adjacent the inner layer of the heater comprising the susceptor element. An induction shielding layer 40 may be provided surrounding the second portion of the flexible electrically insulating substrate 14 comprising the heating element 16. The induction shielding layer 40 may have the function of a flux concentrator. As a consequence, the alternating magnetic field generated by the induction coil 42 may be concentrated on the inside of the heater, particularly in the region of the susceptor element. The third portion of the flexible electrically insulating substrate 28 comprising the power supply 30 is arranged in the embodiment shown in FIG. 5 surrounding the induction shielding layer 40. Surrounding this layer, an insulating and mechanical protection layer 38 is arranged. Surrounding the insulating and mechanical protection layer 38, the first portion of the flexible electrically insulating substrate 10 comprising the control electronics 12 is arranged. As a final outer layer, a finishing layer 36 is provided. The finishing layer 36 is configured to protect the outside of the heater. The finishing layer 36 may be comprise a laminate material. If induction heating is employed in the heater as shown in the embodiment of FIG. 5, only the second portion of the flexible electrically insulating substrate 14 comprising the heating element 16 comprising the induction coil 42, the inner layer comprising the susceptor element 48 and the first portion of the flexible electrically insulating substrate 10 comprising the control electronics 12 are mandatory. All further layers are optional. However, the further layers are beneficial to optimize operation of the heater. Any one of the optional layers described in conjunction with FIG. 5 may be provided in the heater. The layers described in conjunction with FIG. 5 may be manufactured similar to the heater shown in FIGS. 1 to 4. In other words, any one of these layers may be provided on the flat flexible electrically insulating substrate sheet and subsequently rolled to form the heater. Alternatively, any one of these layers may be provided separately and arranged in the tubular heater.

Figure 6:
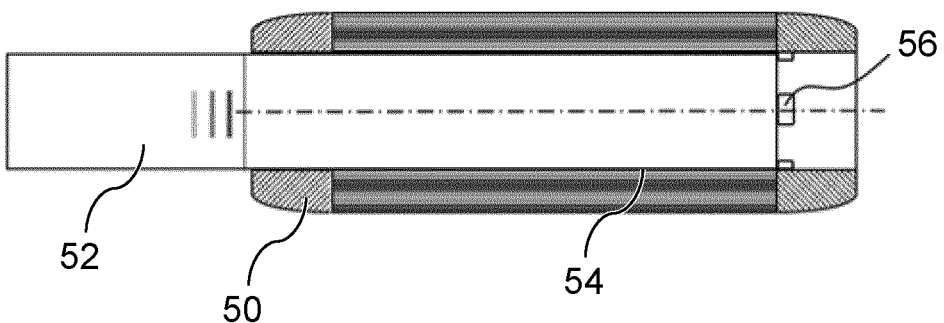
FIG. 6 shows an illustrative view of an aerosol-generating device comprising the heater.

FIG. 6 shows an aerosol-generating device 50. An aerosol-generating article 52 comprising aerosol-forming substrate can be inserted into a cavity 54 of the aerosol-generating device 50. The heater as described herein is arranged around the cavity 54 of the aerosol-generating device 50. At the base of the cavity 54, stopper 56 are arranged. The stopper 56 are configured to prevent over insertion of the aerosol-generating article 52 into the cavity 54.

Figure 7:
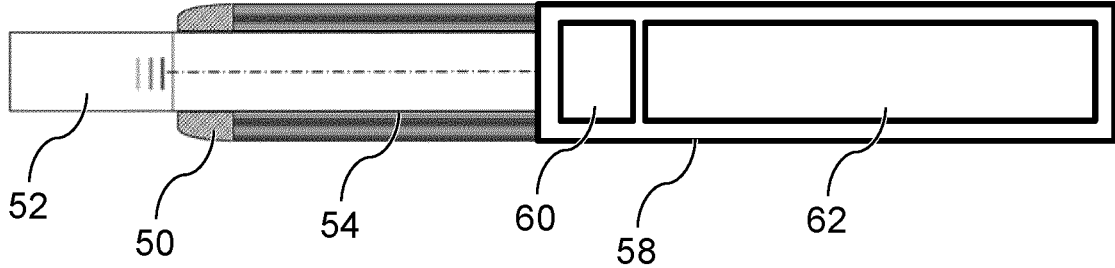
FIG. 7 shows a further embodiment of the aerosol-generating device.

FIG. 7 shows an alternative configuration of the aerosol-generating device 50. In the embodiment shown in FIG. 7, the aerosol-generating device 50 comprises a main body 58. Within the main body 58, a controller 60 and a main power supply 62 in the form of a battery can be arranged. The controller 60 is configured to control the supply of electrical energy from the main power supply 62 to the heater. In contrast to the embodiment of FIG. 6, the energy is therefore supplied by the main power supply 62 of the main body 58. As described herein, the heater itself may comprise a power supply 30. In the embodiment shown in FIG. 6, the aerosol-generating device 50 therefore does not comprise a main power supply 62. The heater of the embodiment shown in FIG. 7 may comprise a power supply 30 so that the additional power supply 62 of the main body 58 acts as a supplementary power supply. Preferably, however, the only power supply is the main power supply 62 of the aerosol-generating device 50.

Figure 8:
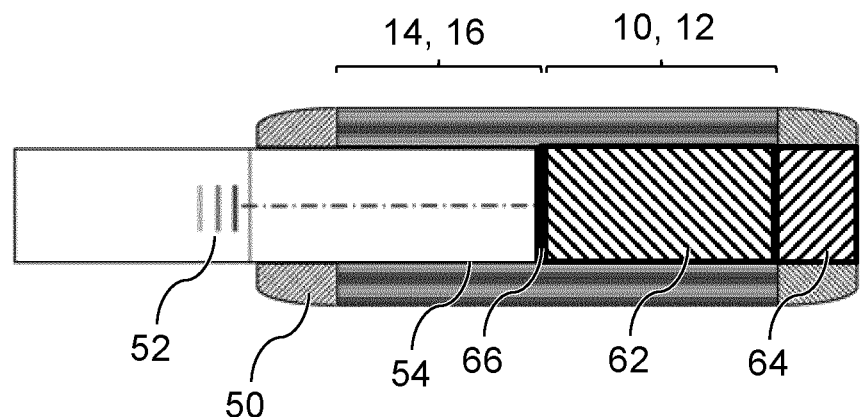
FIG. 8 shows a further embodiment of the aerosol-generating device.

FIG. 8 shows an embodiment, in which the main power supply is a cylindrical battery 62. This embodiment may particularly be used with a configuration of the flexible electrically insulating substrate as shown in FIG. 2B. The first portion of the electrically insulating substrate 10 comprising the control electronics 12 surrounds the main power supply 62. The battery 62 is preferably the only power supply of the device. The second portion of the electrically insulating substrate 14 comprising the heating element 16 surrounds the cavity 54. At the distal end of the device, an end wall 64 is provided. The end wall 64 may comprise electrical connections (not shown) to electrically connect the control electronics 12 with the battery 62. The outer surface of the end wall 64 may also comprise charging contacts (not shown) for recharging the battery 62 from an external power supply, such as a mains supply. Between the aerosol-generating article 52 inserted into the cavity 54 and the battery 62, a sealing wall 66 is provided. The sealing wall 66 will prevent aerosol-forming substrate from the aerosol-generating article 52 to reach and contaminate the battery 62. Moreover, in case of a battery leakage, the sealing wall 66 will prevent contamination of the receiving cavity 54 with undesired chemical compounds. The sealing wall 66 may further act as thermal insulation.

The invention claimed is:

1. A heater for an aerosol-generating device, the heater comprising:
    a flexible electrically insulating substrate comprising a first portion, a second portion, and a fourth portion, wherein the flexible electrically insulating substrate is rolled into a tube;
    control electronics disposed on the first portion of the flexible electrically insulating substrate;
    a heating element comprising an induction coil and being disposed on the second portion of the flexible electrically insulating substrate; and
    a susceptor element arranged on the fourth portion of the flexible electrically insulating substrate.

2. The heater according to claim 1, wherein the first portion of the flexible electrically insulating substrate is arranged at least partly coaxially surrounding an outer perimeter of the second portion of the flexible electrically insulating substrate.

3. The heater according to claim 2, wherein the first portion of the flexible electrically insulating substrate is further arranged fully coaxially surrounding the outer perimeter of the second portion of the flexible electrically insulating substrate.

4. The heater according to claim 1,
    wherein the flexible electrically insulating substrate further comprises a third portion, and
    wherein the heater further comprises a power supply arranged on the third portion of the flexible electrically insulating substrate.

5. The heater according to claim 4, wherein the third portion of the flexible electrically insulating substrate is rolled into a tube.

6. The heater according to claim 5, wherein the second portion of the flexible electrically insulating substrate is arranged at least partly coaxially surrounding an outer perimeter of the third portion of the flexible electrically insulating substrate.

7. The heater according to claim 1, wherein the fourth portion of the flexible electrically insulating substrate is rolled into a tube.

8. The heater according to claim 7, wherein one or both of the second portion of the flexible electrically insulating substrate and a third portion of the flexible electrically insulating substrate is/are arranged at least partly coaxially surrounding an outer perimeter of the fourth portion of the flexible electrically insulating substrate.

9. The heater according to claim 1, further comprising a finishing layer of laminated material arranged at least partly covering the heater.

10. An aerosol-generating device, comprising:
    a cavity configured to receive an aerosol-generating article comprising an aerosol-forming substrate; and
    the heater according to claim 1, wherein the heater is arranged at least partly coaxially surrounding an outer perimeter of the cavity.

11. The aerosol-generating device according to claim 10, wherein the heater at least partly forms a sidewall of the cavity.

12. A system comprising the aerosol-generating device according to claim 10 and an aerosol-generating article comprising an aerosol-forming substrate.

* * * * *